(12) United States Patent  
Ruttenberg et al.

(10) Patent No.: US 12,079,145 B2
(45) Date of Patent: Sep. 3, 2024

(54) DISTRIBUTION OF DATA AND MEMORY TIMING PARAMETERS ACROSS MEMORY MODULES BASED ON MEMORY ACCESS PATTERNS

(71) Applicant: ADVANCED MICRO DEVICES, INC., Santa Clara, CA (US)

(72) Inventors: Max Ruttenberg, Bellevue, WA (US); Vendula Venkata Srikant Bharadwaj, Bellevue, WA (US); Yasuko Eckert, Bellevue, WA (US); Anthony Gutierrez, Bellevue, WA (US); Mark H. Oskin, Bellevue, WA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 18/103,240

(22) Filed: Jan. 30, 2023

(65) Prior Publication Data

US 2023/0185742 A1    Jun. 15, 2023

Related U.S. Application Data

(63) Continuation of application No. 17/130,604, filed on Dec. 22, 2020, now Pat. No. 11,586,563.

(51) Int. Cl.
G06F 13/16     (2006.01)
G11C 11/4076   (2006.01)

(52) U.S. Cl.
CPC ...... G06F 13/1668 (2013.01); G11C 11/4076 (2013.01)

(58) Field of Classification Search
CPC .. G06F 13/1668; G06F 21/55; G06F 16/9574; G11C 11/4076
See application file for complete search history.

(56) References Cited

U.S. PATENT DOCUMENTS

| 2005/0240745 A1* | 10/2005 | Iyer | G06F 13/1668 |
| | | | 711/E12.079 |
| 2016/0124873 A1* | 5/2016 | Xu | G06F 12/023 |
| | | | 711/167 |
| 2017/0018305 A1* | 1/2017 | Chuang | G11C 13/0035 |
| 2019/0034365 A1* | 1/2019 | Lovelace | G06F 13/1684 |

* cited by examiner

Primary Examiner — Ajay Ojha

(57) ABSTRACT

A processor distributes memory timing parameters and data among different memory modules based upon memory access patterns. The memory access patterns indicate different types, or classes, of data for an executing workload, with each class associated with different memory access characteristics, such as different row buffer hit rate levels, different frequencies of access, different criticalities, and the like. The processor assigns each memory module to a data class and sets the memory timing parameters for each memory module according to the module's assigned data class, thereby tailoring the memory timing parameters for efficient access of the corresponding data.

19 Claims, 4 Drawing Sheets

DISTRIBUTION OF DATA AND MEMORY TIMING PARAMETERS ACROSS MEMORY MODULES BASED ON MEMORY ACCESS PATTERNS

CROSS-REFERENCE TO RELATED APPLICATIONS

The present application is a Continuation application of U.S. patent application Ser. No. 17/130,604, entitled "DISTRIBUTION OF DATA AND MEMORY TIMING PARAMETERS ACROSS MEMORY MODULES BASED ON MEMORY ACCESS PATTERNS", and filed on Dec. 22, 2020, now issued as U.S. Pat. No. 11,586,563, the entirety of which is incorporated by reference herein.

BACKGROUND

For some processing systems, memory performance puts a constraint on overall system performance. For example, a graphics processing unit (GPU) of a processing system can generate a high amount of memory traffic, and the performance of the memory can limit the overall speed with which the GPU executes its assigned operations. One approach to improve memory performance is by adjusting the architecture of the memory and memory interface, such as by employing High Bandwidth Memory (HBM) interfaces and three-dimensional (3D) stacked memory architectures. Another approach is to employ dynamic voltage and frequency (DVFS) techniques to adjust the voltage and clock frequency supplied to the memory based on the processing system's power and performance constraints. However, existing DVFS techniques can undesirably limit system performance while allowing the system to consume a relatively high amount of power.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Figure 1:
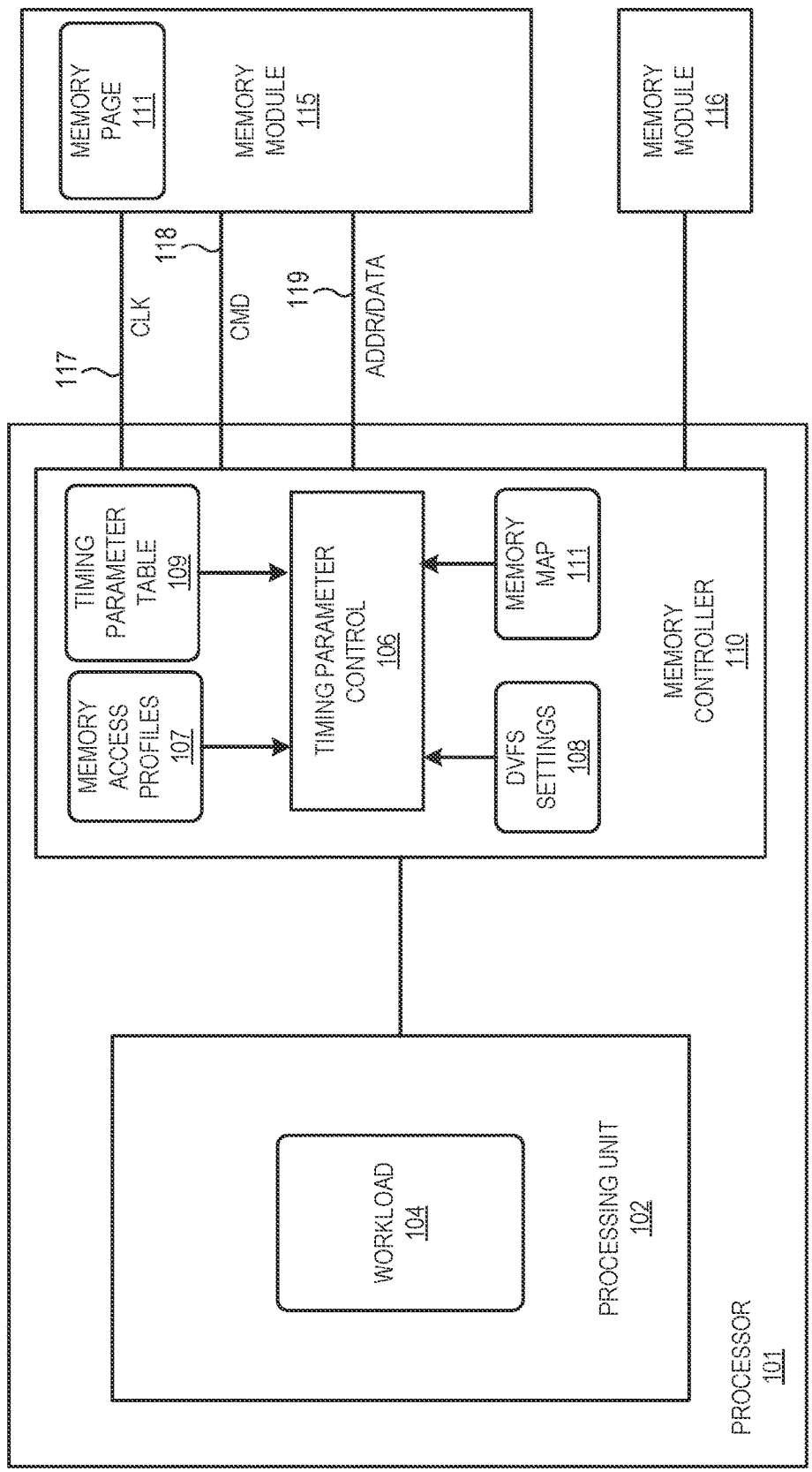
FIG. 1 is a block diagram of a processing system that sets memory timing parameters for different memory modules based on memory access patterns of a workload in accordance with some embodiments.

FIGS. 1-5 illustrate techniques for a processor to distribute memory timing parameters and data among different memory modules based upon memory access patterns. The memory access patterns indicate different types, or classes, of data for an executing workload, with each class associated with different memory access characteristics, such as different row buffer hit rate levels, different frequencies of access, different criticalities, and the like. The processor assigns each memory module to a data class and sets the memory timing parameters for each memory module according to the module's assigned data class, thereby tailoring the memory timing parameters for efficient access of the corresponding data, and thus improving overall processing system performance.

To illustrate, in some embodiments a processing system employs DRAM modules that have adjustable timing parameters, such as memory clock frequency, command delay parameters (e.g., Row Address Strobe (RAS) to Column Address Strobe Delay (RCD) parameters), and the like. Conventionally, a processor of the processing system sets the timing parameters to comply with specifications set by, for example, a vendor of the DRAM modules. However, the vendor often sets the specifications for the timing parameters conservatively and based on a maximum expected temperature that may not hold for the actual operating conditions of the processor.

Furthermore, in many cases a given application or other workload accesses different data within the workload's address space according to different access patterns, so that different regions of memory within the address space have different memory access characteristics, such as spatial locality, frequency of access, criticality (i.e. the degree to which a processor can perform other useful work while waiting for data from the memory region), and the like. The different memory access patterns have different performance sensitivities to the different memory timing parameters. For example, in some cases the performance of a given memory access pattern is improved by increasing the memory clock frequency, while the performance of a different memory access pattern is relatively insensitive to the memory clock frequency, but instead is improved by reducing the RCD (e.g. RCDRD and RCDWR) parameters. Using the techniques described herein, a processor identifies the memory access behavior for each class of data associated with a workload, assigns each class to a set of memory modules, and sets the memory timing parameters for each set of memory modules based on the assigned class of data, thereby tailoring the timing characteristics of the DRAM modules according to the expected pattern of memory accesses to the data, and thus improving overall performance of the processing system.

To illustrate via an example, in some embodiments a memory controller determines that an application accesses two different sets of data within the application's address space according to two different memory access patterns. The two sets of data are designated for purposes of the example as Data Set A and Data Set B, respectively. The memory controller determines that the memory access pattern for Data Set A, designated Pattern A, is characterized by a high row buffer hit rate, a high frequency of access, and a low criticality. The memory controller further determines that the memory access pattern for Data Set B, designated Pattern B, is characterized by a low row buffer hit rate, a low frequency of access, and a high criticality.

After identifying Pattern A and Pattern B, the memory controller determines (e.g., based on a specified lookup table or other data structure) the memory timing parameters for each pattern, wherein the memory timing parameters are tailored to result in efficient memory access for the corresponding memory access pattern. For this example, the memory controller determines that the memory timing parameters for Pattern A correspond to a relatively high memory clock frequency, and that the memory timing parameters for Pattern B correspond to a low page activation and memory precharge latency. Accordingly, the memory controller assigns the memory addresses for Data Set A to one set of memory modules, designated MM Set A, and assigns the memory addresses for Data Set B to a different set of memory modules, designated MM Set B. The memory controller thereby ensures that Data Set A is stored at MM Set A and Data Set B is stored at MM Set B. The memory controller sets the memory timing parameters for each MM Set to the memory timing parameters for the corresponding access Pattern. Thus, the memory controller sets the memory timing parameters for MM Set A to establish a relatively high memory clock frequency and sets the memory timing parameters for MM Set B to establish a low page activation and precharge latency. The memory controller thereby sets the memory timing parameters for each set of data based on the expected memory access patterns to the data set.

FIG. 1 illustrates a processing system 100 that sets memory timing parameters for each of a plurality of memory modules based on memory access patterns in accordance with some embodiments. The processing system 100 is generally configured to execute sets of instructions (e.g., applications) that, when executed, manipulate one or more aspects of an electronic device in order to carry out tasks specified by the sets of instructions. Accordingly, in different embodiments the processing system 100 is part of one of a variety of electronic devices, such as a desktop computer, laptop computer, server, smartphone, tablet, game console, and the like.

To facilitate execution of the sets of instructions, the processing system 100 includes a processor 101 and a plurality of memory modules (e.g., memory modules 115, 116). It will be appreciated that, at least in some embodiments, the processing system 100 includes additional modules and components not illustrated at FIG. 1, such as additional processors, memory modules, data storage components (e.g., disk drives), input/output controllers and devices, and the like.

The processor 101 is generally configured to execute the applications and other sets of instructions on behalf of the processing system 100. The memory modules 115 are generally configured to store data that is manipulated by the sets of instructions when executed by the processor 101. For purposes of description, it is assumed that the memory modules 115 and 116 are DRAM modules, such as dual in-line memory modules (DIMMs). In some embodiments, each of the memory modules 115 and 116 are different memory modules of an HBM memory stack. For example, in some embodiments the memory modules 115 and 116 are formed in different integrated circuit dies, with the dies arranged in a 3D stack with an HBM controller die. An integrated circuit die and the 3D stack are placed on top of a silicon interposer, wherein the interposer includes electrical connectivity structures (e.g. vias and other interconnects) to provide connections between the processor 101 and the memory modules 115 and 116, as described further herein.

In the course of executing the sets of instructions, the processor 101 generates operations, referred to herein as memory accesses. Examples of memory accesses include read operations (also referred to as a memory read) that retrieve data from a memory module and write operations (also referred to as a memory write) that write data to the memory module. To support memory accesses, the processor 101 is connected to each memory module via a set of busses. For example, the processor 101 is connected to the memory module 115 via a clock bus 117, a command bus 118, and an address/data bus 119. These busses are collectively referred to as the memory busses 117-119. It will be appreciated that while the address/data bus 119 is illustrated as a single bus, in other embodiments the processor 101 is connected to the memory module 115 via separate address and data busses. In addition, in some embodiments the memory busses 117-119 represent additional or different busses and connections to those illustrated at FIG. 1, such as one or more busses or connections to carry data strobe signals.

To execute a memory operation, the processor 101 provides specified memory signaling on the memory busses 117-119, such as a clock signal via the clock bus 117, one or more commands via the command bus 118, and a memory address and data via the address/data bus 119. In response, the memory module 115 executes the memory operation indicated by the memory signaling. For some operations (e.g., memory reads), the memory module 115 provides responsive information via the memory busses 117-119, such as providing data via the address/data bus 119. The execution of the memory operations at the memory module 115 is governed by one or more memory timing parameters that govern how quickly the memory module 115 carries out specified tasks that support the memory operations. One example of a memory timing parameter is the frequency of the clock signal provided by the processor 101 via the clock bus 117. As the frequency of the clock signal increases, the memory module 115 executes at least some memory operations, such as read and write operations, more quickly.

Other memory timing parameters govern the speed with which the memory module 115 executes associated tasks that support memory operations. For example, in some embodiments the memory module 115 includes a storage array that stores a relatively large amount of data that is accessed relatively slowly and a row buffer that stores a relatively small amount of data that is accessed relatively quickly. To increase overall access speeds, in response to a memory access to a location of the storage array, the memory module 115 loads a specified block of data, referred to as a memory page (e.g. memory page 111) into the row buffer and satisfies memory accesses targeted to the memory page from the row buffer. This allows frequent accesses to the memory page over a short amount of time to be executed relatively quickly. The speed with which the memory module 115 loads a page to the row buffer is governed by one or more memory timing parameters, such as one or more page-loading parameters. Other examples of memory timing parameters include a row precharge parameter, a column-to-column delay parameter, a row-to-row delay parameter, a four-bank activation window parameter, a write recovery (WR) parameter indicating a time between writing and precharging, a read to precharge (RTP) parameter indicating a time between a read and a precharge, a refresh interval (REFI) parameter based on the frequency of memory access, and the like.

In some embodiments, one or more of the memory timing parameters that govern operations at the memory modules 115 and 116 are adjustable. For example, in some embodiments the clock frequency of the memory clock signal provided via the clock bus 117 is adjustable by the processor 101. Other memory timing parameters are adjusted by the processor 101 sending a specified command to the memory module 115 via the command bus 118. Still other memory timing parameters are adjusted by the processor 101 changing the voltage of the memory signaling provided to the memory module 115. However, in some cases adjusting a memory timing parameter above a specified level or outside of a specified range has associated costs, such as raising the temperature of one or more components of the processing system 100, wherein such costs impact overall system performance. Further, in at least some embodiments adjusting the memory timing parameters outside of a specified range does not provide performance benefits for a given workload executing at the processor 101. Accordingly, in some embodiments the processor 101 is configured to adjust the memory timing parameters associated with the memory modules 115 and 116 based on the expected memory access behavior of a workload executing at the processor 101.

To illustrate, the processor 101 includes a processing unit 102 and a memory controller 110. The processing unit 102 includes one or more processor cores, compute units, or other processing elements generally configured to execute sets of instructions or commands based on the sets of the instructions. Thus, in some embodiments the processing unit 102 is a central processing unit (CPU) that includes one or more processor cores configured to execute threads of instructions on behalf of the processor 101. In other embodiments, the processing unit 102 is a graphics processing unit (GPU) that includes one or more compute units configured to execute vector and graphics processing operations based on commands received from a CPU. It will be appreciated that although FIG. 1 illustrates a single processing unit 102 for convenience, in other embodiments the processor 101 or the processing system 100 includes additional processing units not illustrated at FIG. 1.

The processing unit 102 executes sets of operations collectively referred to as workloads (e.g., workload 104). In different embodiments the workload 104 represents different granularities of operations. For example, in some embodiments the workload 104 represents all the operations associated with a corresponding application. In other embodiments, the application has multiple phases, with each phase corresponding to a different pattern of memory access behavior, and the workload 104 represents the operations corresponding with one of the multiple phases of the application.

The memory controller 110 is generally configured to manage the execution of memory operations executed by the processing unit 102. For example, in some embodiments the memory controller 110 manages the logical and physical (PHY) layer operations associated with the memory accesses. Thus, in some embodiments the memory controller 110 performs tasks such as buffering of memory accesses, address translation for memory accesses, generating memory signaling based on memory accesses, providing the memory signaling via the memory busses 117-119, buffering data received in response to the memory accesses, and providing the responsive data to the processing unit 102.

In addition, the memory controller 110 is configured to adjust the memory timing parameters of one or more of the memory modules 115 and 116 based on the expected memory access patterns of the workload 104. To illustrate, the memory controller 110 includes a timing parameter control module 106 that is configured to 1) determine the memory access patterns associated with different sets of data accessed by the workload 104; 2) assign the different sets of data to different ones of the memory modules 115 and 116; and 3) set the timing parameters for each of the memory modules 115 and 116 according to their assigned data sets.

To illustrate, the timing parameter control module 106 is configured to access a set of memory access profiles 107 that indicate the expected memory access profiles for workloads to be executed by the processing unit 102. In some embodiments, a memory access profile for a workload indicates different sets of data to be accessed by the workload, the virtual memory addresses for the different sets of data, and memory access characteristics associated with each data set. In different embodiments, the memory access characteristics include one or more of a memory traffic rate associated with the corresponding data set, a number of memory accesses (reads, writes, or both) associated with the data set, memory access sizes for the data set, memory page hits, misses, or conflicts associated with the data set, a spatial locality of memory accesses associated with the data set, and the like, row-buffer hit rates, congestion metrics, processor stall cycles, a write-to-read ratio, a memory channel contention indicator, or any combination thereof.

In different embodiments, the memory access profile for the workload 104 is generated in different ways. For example, in some embodiments the memory access profile for the workload 104 is generated by a programmer or developer of the corresponding application, such as by testing and characterizing the memory access patterns for the application in a test environment. The programmer or developer of the application indicates the memory access profile for the workload 104 via a set of compiler hooks and data flags that identify the different sets of data and corresponding virtual memory addresses, and the memory access characteristics for the identified data sets. In other embodiments, the memory access profile for the workload 104 is generated by an operating system (OS) executing at the processor 101 using performance information stored at a set of performance counters (not show). The OS periodically reads the performance counters to evaluate metrics such as the row-buffer hit rate, processor stall cycles due to pending memory requests, and congestion in the memory system. The OS uses this information to classify the memory access behaviors for the different data sets, thereby generating the memory access profile for the workload 104.

The timing parameter control module 106 assigns each data set identified by the memory access profile to at least one corresponding memory module. In some embodiments, the timing parameter control module 106 assigns a data set by mapping the virtual addresses for the data set, as generated by the workload 104 or the OS, to physical addresses of the assigned memory module. The timing parameter control module 106 stores the mapping at a memory map 111, and the memory controller 110 employs the memory map 111 to perform address translation when executing memory access operations, such as read and write operations.

The timing parameter control module 106 sets the memory timing parameters for each memory module based on a timing parameter table 109 that specifies the memory timing parameters for different memory access patterns. For example, in some embodiments the timing parameter control table indicates memory timing parameter values for each of a specified set of memory access patterns. The memory timing parameter values are specified to support a particular memory access profile, including a desired power consumption level, memory performance level, and the like. In some embodiments, the timing parameter table 109 is specified by the workload 104 or a corresponding application. In other embodiments, the timing parameter table 109 is generated by the OS executing at the processor 101.

For each memory module, the timing parameter control module 106 identifies the sets of data assigned to the memory module, identifies the memory access profile for each data set, as indicated by the memory access profiles 107, and identifies the memory timing parameter values for the indicated memory access profile, as indicated by a corresponding entry timing parameter table 109. The timing parameter control module 106 sets the memory timing parameters the memory module to the identified values by performing one or more of 1) setting the memory clock frequency for the memory module to a specified value; 2) sending one or more commands to the memory module to set corresponding memory timing parameters; and 3) sending one or more commands to the memory module to change a power mode of the memory module (e.g., placing the memory module in a low-power mode).

In some embodiments, in addition to employing the memory access profiles 107 to set the memory timing parameters, the timing parameter control module 106 also employs a set of dynamic voltage and frequency scaling (DVFS) settings 108. For example, in some embodiments the OS sets the DVFS settings 108 based on characteristics of the workload 104 or other system settings to achieve a specified combination of performance and power consumption. In some embodiments the timing parameter control module 106 sets at least some of the memory timing parameters for a memory module based on the DVFS settings 108 while setting others of the memory timing parameters for the memory module based on the memory access profiles 107. For example, in some embodiments the timing parameter control module sets the memory clock frequency and power mode for a memory module based on the DVFS settings 108, while setting the page activation and precharge latency for the memory module based on the memory access profiles 107.

Figure 2:
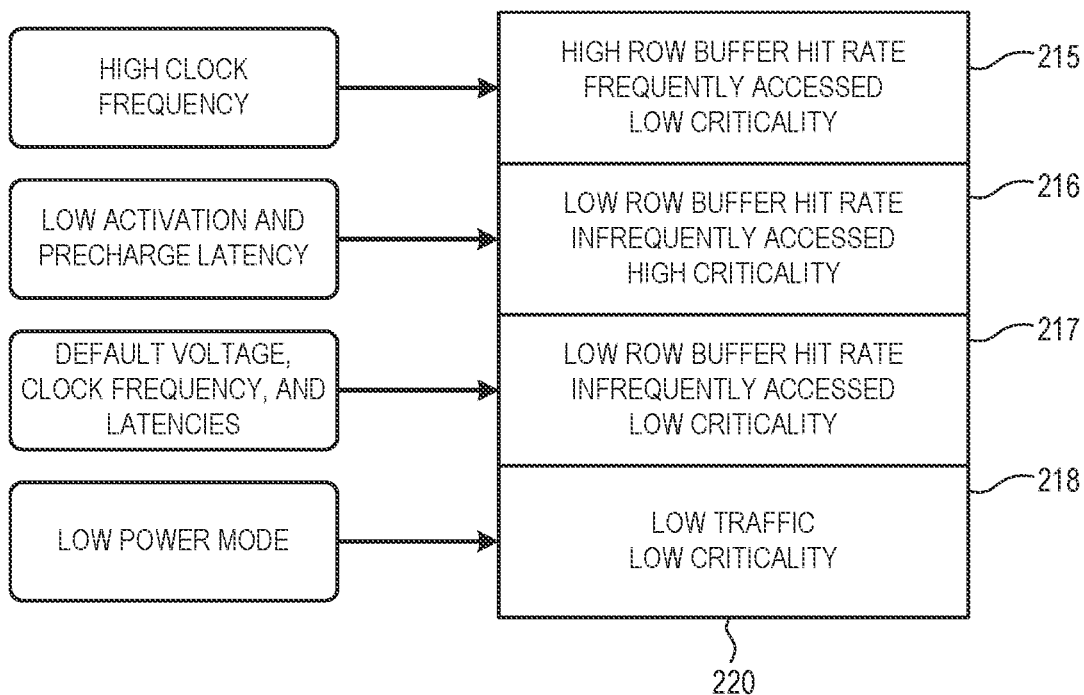
FIG. 2 is an example of the processing system of FIG. 1 setting memory timing parameters differently for different memory modules based on memory access patterns in accordance with some embodiments.

FIG. 2 illustrates an example of the processor 101 setting different memory timing parameters for different memory modules based on expected memory access patterns in accordance with some embodiments. FIG. 2 illustrates an HBM memory stack 220 including memory modules 215, 216, 217, and 218. In the depicted example, the memory controller 110 has determined, based on the memory access profiles 107, that the workload 104 is expected to access four different sets of data with different memory access patterns, and has assigned the different data sets to different ones of the memory modules 215-218. In particular, the memory controller 110 has assigned a data set associated with an access pattern of a high row buffer hit rate, a high access frequency, and a low criticality to memory module 215. The memory controller 110 has further assigned a data set associated with an access pattern of a low row buffer hit rate, a low access frequency, and a high criticality to memory module 216. In addition, the memory controller 110 has assigned a data set associated with an access pattern of a low row buffer hit rate, a low access frequency, and a low criticality to memory module 217. The memory controller 110 has also assigned a data set associated with an access pattern of a low traffic rate and a low criticality to memory module 218.

Based on the expected access patterns to each memory module, and based on the timing parameter table 109, the memory controller 110 sets the timing parameters for each of the memory modules 215-218. Thus, in the example of FIG. 2, the memory controller 110 sets the memory clock frequency for the memory module 215 to a relatively high value. For the memory module 216, the memory controller 110 sets the page activation latency and precharge latency parameters to relatively low values. For the memory module 217, the memory controller 110 sets the operating voltage, memory clock frequency, and access latency values to default or nominal values. For the memory module 218, the memory controller 110 places the module in a low power mode. Thus, the memory controller 110 tailors the memory timing parameters for each memory module to support efficient execution of the corresponding memory access pattern, thereby improving overall memory access efficiency and reducing overall system power consumption.

Figure 3:
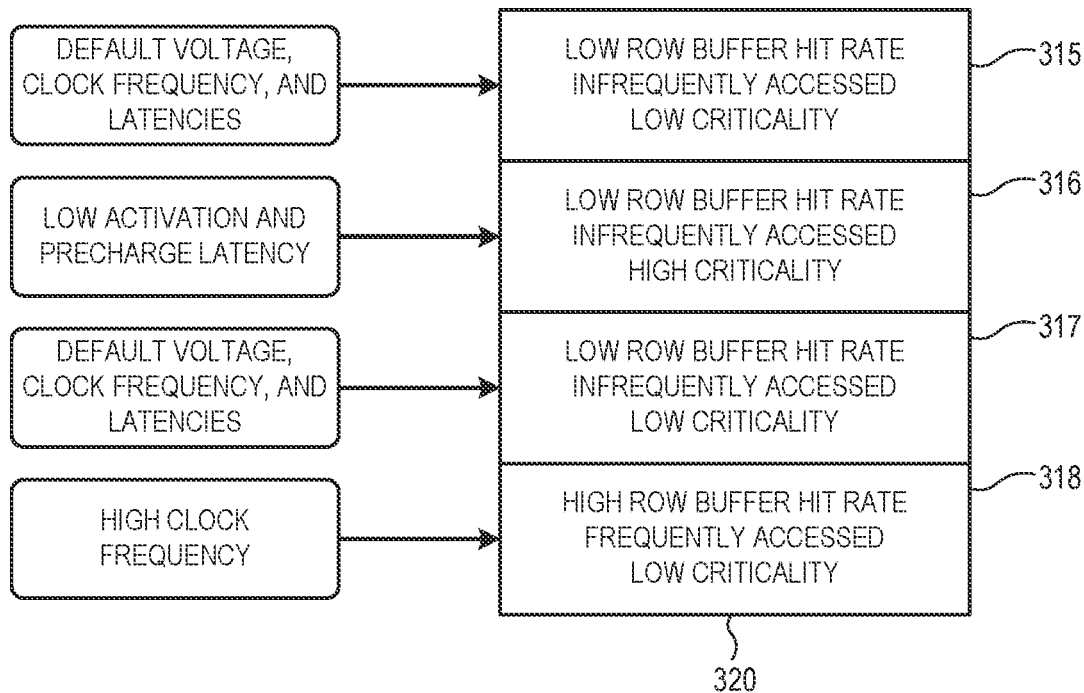
FIG. 3 is another example of the processing system of FIG. 1 setting memory timing parameters differently for different memory modules based on memory access patterns in accordance with some embodiments.

In the example of FIG. 2, the memory timing parameters for each of the memory modules 215-218 are set to different values, as each memory module is associated with a different memory access pattern. In other embodiments, two or more of the memory modules are associated with the same or similar memory access patterns, and the memory timing parameters for these memory modules are set similarly. An example is illustrated at FIG. 3 in accordance with some embodiments. FIG. 3 depicts an HBM memory stack 320 having four memory modules 315, 316, 317, and 318. Similar to the example of FIG. 2, the memory controller sets the memory timing parameters for each of the memory modules 315-318 based upon the expected memory access patterns associated with the data sets assigned to the different memory modules. However, in the example of FIG. 3, the memory modules 315 and 317 are each assigned data sets associated with a memory access pattern of a low row buffer hit rate, a low access frequency, and a low criticality. Accordingly, the memory controller 110 sets the memory timing parameters for the memory modules 315 and 317 similarly. In particular, the memory controller 110 sets the memory voltage, memory clock frequency, and latency parameters for each of the memory modules 315 and 317 to default or nominal values.

Figure 4:
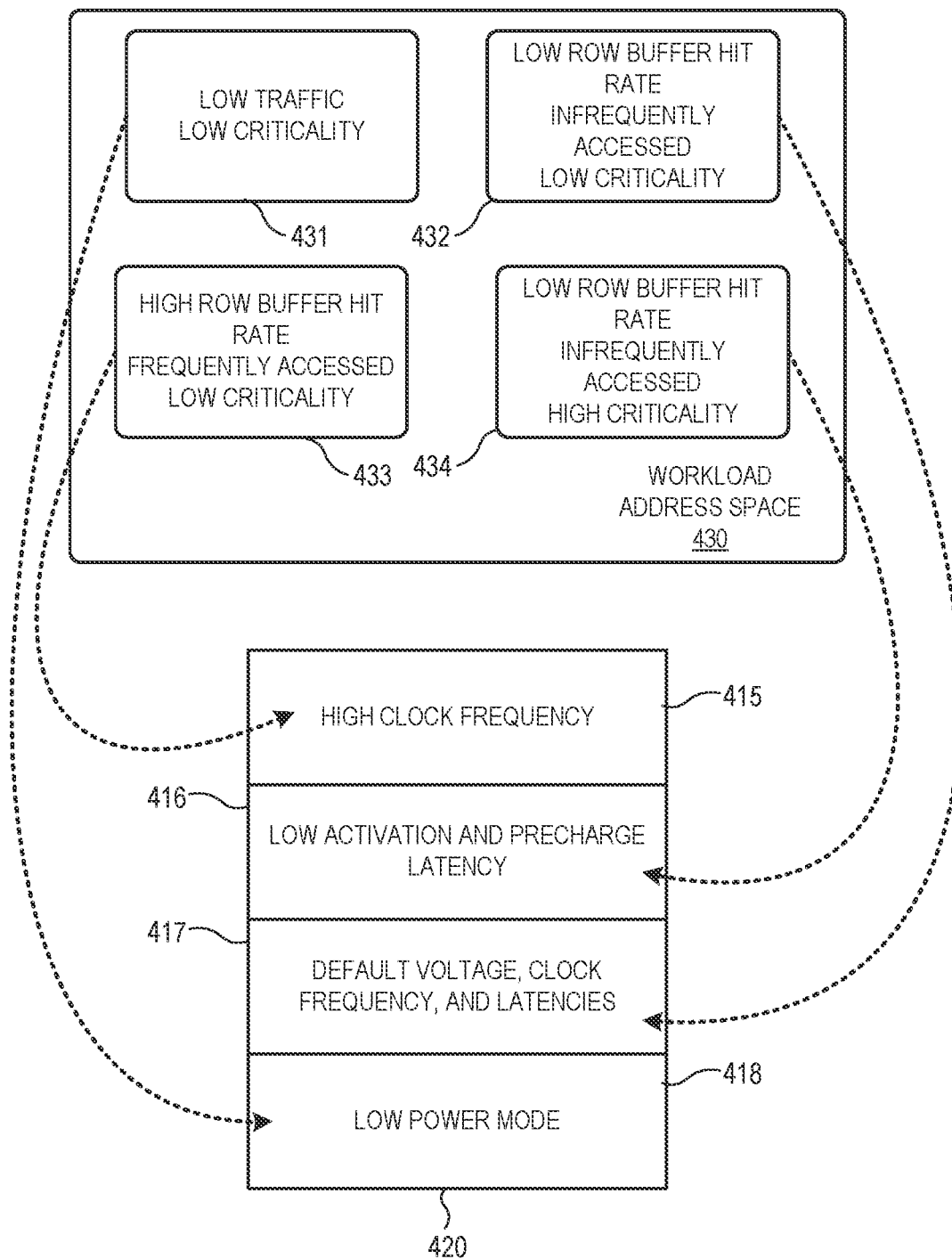
FIG. 4 is a block diagram illustrating the distribution of different classes of data to different memory modules of the processing system of FIG. 1 based on different memory timing parameters in accordance with some embodiments.

FIG. 4 illustrates an example of the memory controller 110 assigning different data sets of the workload 104 to different memory modules in accordance with some embodiments. FIG. 4 illustrates an HBM memory stack 420 including four memory modules, designated memory modules 415, 416, 417, and 418. FIG. 4 further illustrates a workload address space 430, which represents the memory address space for the data that the workload 104 is expected to access.

In the depicted example, the memory controller 110 has identified, based on the memory access profiles 107, that the workload address space 430 includes four different data sets, designated data sets 431, 432, 433, and 434, with each of the data sets 431-434 corresponding to a different memory access pattern. Thus, the data set 431 corresponds to data associated with a memory access pattern having a low amount of memory traffic and a low criticality. The data set 432 corresponds to data associated with a memory access pattern having a low row buffer hit rate, a low access frequency, and a low criticality. The data set 433 corresponds to data associated with a memory access pattern having a high row buffer hit rate, a high access frequency, and a low criticality. The data set 434 corresponds to data associated with a memory access pattern having a low row buffer hit rate, a low access frequency, and a high criticality.

In the example of FIG. 4, the memory controller 110 assigns each of the data sets 431-434 to different ones of the memory modules 415-418, and sets the memory timing parameters for each of the memory modules 415-418 according to the memory access pattern of the assigned data set. Thus, the memory controller 110 sets the memory clock frequency for the memory module 415 to a relatively high value to support efficient accesses to the data set 433. In addition, the memory controller 110 sets the activation and precharge latency values for the memory module 416 to relatively low values, thereby supporting efficient memory accesses to the data set 434. The memory controller 110 sets the memory voltage, memory clock frequency, and latency values for the memory module 417 to default or nominal values, thereby supporting efficient access to the data set 431. Furthermore, the memory controller 110 sets the memory module 418 to a low power mode, thereby supporting efficient accesses to the data set 431.

Figure 5:
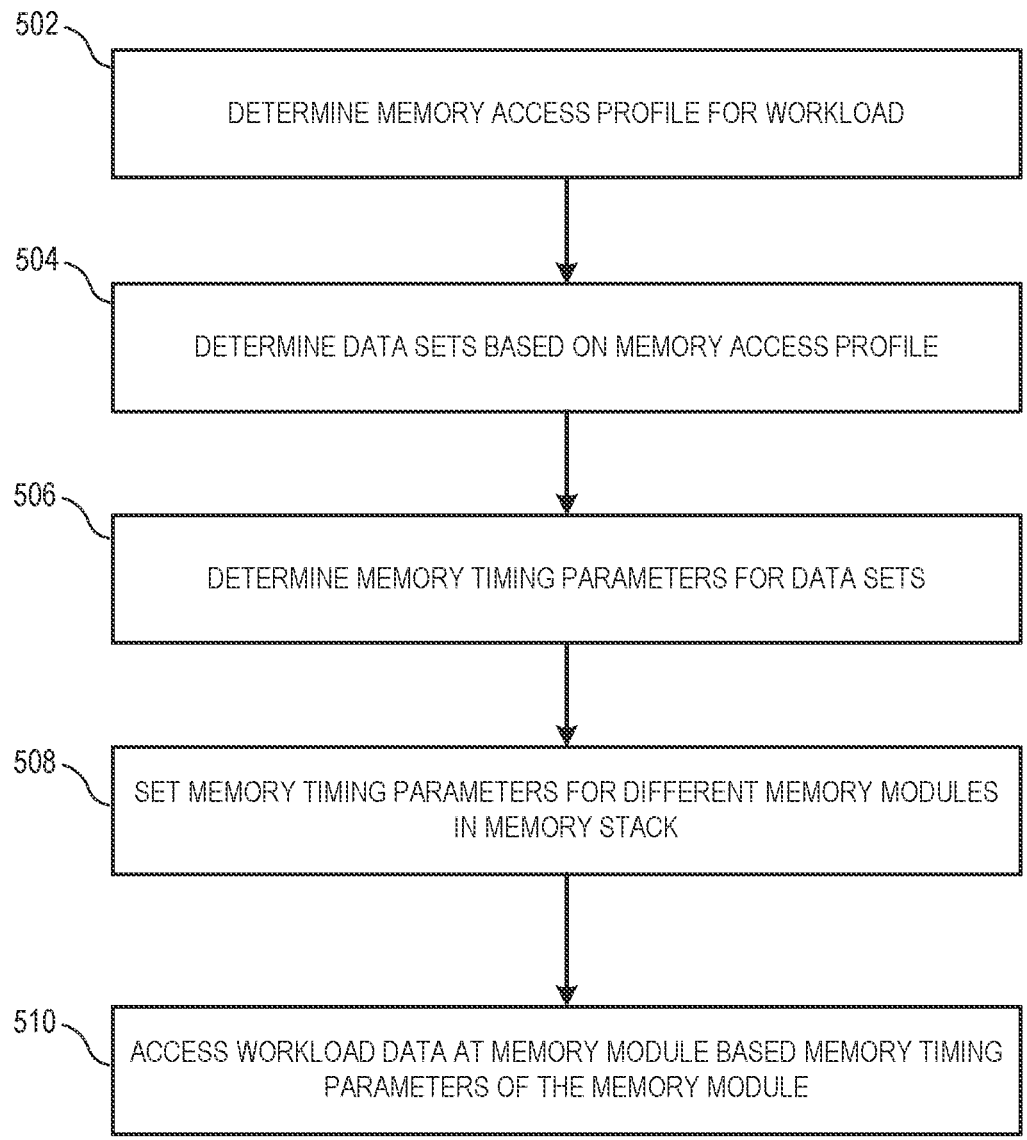
FIG. 5 is a flow diagram illustrating a method of distributing different sets of data to different memory modules based on different memory timing parameters in accordance with some embodiments.

FIG. 5 illustrates a flow diagram of a method 500 of distributing different sets of data to different memory modules based on different memory timing parameters in accordance with some embodiments. For purposes of description, the method 500 is described with respect to an example implementation at the processing system 100 of FIG. 1. At block 502, the timing parameter control module 106 identifies which of the memory access profiles 107 corresponds to the workload 104 executing at the processor 101. In some embodiments, the timing parameter control module identifies the memory access profile by using a program identifier associated with the workload 104 to index a table that stores the memory access profiles 107.

At block 504, the timing parameter control module 106 uses the memory access profile identified at block 502 to identify the data sets associated with the workload 104. In addition, the timing parameter control module determines the memory access pattern associated with each of the identified data sets. At block 506, the timing parameter control module 106 uses the timing parameter table 109 to identify the timing parameters for the data sets based on the corresponding memory access patterns. At block 508, the memory controller 110 assigns each data set to a memory module and sets the memory timing parameters for each memory module to the corresponding timing parameters identified at block 506. At block 510, the workload 104 accesses data at the memory modules by sending memory access operations (e.g., read and write operations) to the memory controller 110. The memory controller 110 executes the read and write operations to access the data at the memory modules, using the memory timing parameters for each memory module set at block 508.

In some embodiments, certain aspects of the techniques described above may implemented by one or more processors of a processing system executing software. The software includes one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A method comprising:
   identifying, for each of a plurality of memory modules, a corresponding memory access profile based on a workload to be executed at a processor; and
   setting a memory timing parameter for each of the plurality of memory modules based on the corresponding memory access profile, wherein setting of the memory timing parameter for each of the plurality of memory modules is based on an expected pattern of memory access to data for executing the workload.

2. The method of claim 1, wherein each memory module of the plurality of memory modules is formed in a different integrated circuit die of a plurality of integrated circuit dies.

3. The method of claim 2, wherein the plurality of integrated circuit dies is arranged in a three-dimensional (3D) stack.

4. The method of claim 1, wherein identifying the corresponding memory access profile comprises identifying at least one of a row buffer hit rate, a number of processor stall cycles due to pending memory accesses, and a memory congestion metric.

5. The method of claim 1, further comprising transferring data from a first of the plurality of memory modules to a second of the plurality of memory modules based on a class of data for each of the plurality of memory modules.

6. The method of claim 1, further comprising adjusting a power setting of at least one of the plurality of memory modules based on the corresponding memory access profile.

7. The method of claim 1, wherein setting the memory timing parameter for each of the plurality of memory modules comprises:
   setting the memory timing parameter for a first memory module to a first value; and
   setting the memory timing parameter for a second memory module to a second value, the second value different from the first value.

8. The method of claim 1, wherein the memory timing parameter includes at least one of a page loading parameter, a row precharge parameter, a column-to-column delay parameter, a row-to-row delay parameter, a four-bank activation window parameter, a write recovery (WR) parameter indicating a time between writing and precharging, a read to precharge (RTP) parameter indicating a time between a read and a precharge, and a refresh interval (REFI) parameter.

9. The method of claim 1, further comprising:
transferring data from a first of the plurality of memory modules to a second of the plurality of memory modules based on the setting of the memory timing parameter for each of the plurality of memory modules.

10. The method of claim 1, wherein the workload represents different granularities of one or more operations executing at the processor.

11. The method of claim 10, wherein the workload represents all of the operations associated with executing an application.

12. The method of claim 10, wherein the workload represents one phase of a plurality of phases of an application, wherein each of the plurality of phases corresponds to a different pattern of memory access behavior.

13. A processor comprising:
a memory controller configured to identify, for each of a plurality of memory modules, a corresponding memory access profile based on a workload to be executed at the processor,
wherein the memory controller is configured to set a memory timing parameter for each of the plurality of memory modules based on the corresponding memory access profile,
wherein the memory controller is further configured to set the memory timing parameter for each of the plurality of memory modules based on an expected pattern of memory access to data for executing the workload.

14. The processor of claim 13, wherein the memory controller is configured to set the memory timing parameter for each of the plurality of memory modules by:
setting the memory timing parameter for a first memory module to a first value; and
setting the memory timing parameter for a second memory module to a second value, the second value different from the first value.

15. The processor of claim 13, wherein the memory timing parameter includes at least one of a page loading parameter, a row precharge parameter, a column-to-column delay parameter, a row-to-row delay parameter, a four-bank activation window parameter, a write recovery (WR) parameter indicating a time between writing and precharging, a read to precharge (RTP) parameter indicating a time between a read and a precharge, and a refresh interval (REFI) parameter.

16. The processor of claim 13, wherein the memory controller is configured to identify the corresponding memory access profile by identifying at least one of a row buffer hit rate, a number of processor stall cycles due to pending memory accesses, and a memory congestion metric.

17. The processor of claim 13, wherein the memory controller is configured to identify the corresponding memory access profile by identifying a corresponding criticality metric for data stored at each of the plurality of memory modules.

18. The processor of claim 13, wherein each of the plurality of memory modules are formed in a different integrated circuit die of a plurality of integrated circuit dies, wherein the plurality of integrated circuit dies is arranged in a three-dimensional (3D) stack.

19. A processing system comprising:
a plurality of memory modules;
a processor coupled to the plurality of memory modules, the processor comprising a memory controller configured to:
identify, for each of the plurality of memory modules, a corresponding memory access profile based on a workload to be executed at the processor; and
set a memory timing parameter for each of the plurality of memory modules based on the corresponding memory access profile,
wherein the memory controller is further configured to set the memory timing parameter for each of the plurality of memory modules based on an expected pattern of memory access to data for executing the workload.

* * * * *